(12) United States Patent
Koh

(10) Patent No.: US 7,485,574 B2
(45) Date of Patent: Feb. 3, 2009

(54) METHODS OF FORMING A METAL LINE IN A SEMICONDUCTOR DEVICE

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 119 days.

(21) Appl. No.: 11/257,639

(22) Filed: Oct. 25, 2005

(65) Prior Publication Data

US 2006/0094220 A1    May 4, 2006

(30) Foreign Application Priority Data

Nov. 1, 2004    (KR) .................. 10-2004-0087883

(51) Int. Cl.
*H01L 21/4763* (2006.01)

(52) U.S. Cl. .................. 438/638; 257/E21.577; 257/E21.586

(58) Field of Classification Search .............. 438/677, 438/738, 638; 257/E21.577, E21.586
See application file for complete search history.

(56) References Cited

U.S. PATENT DOCUMENTS

| | | | | |
|---|---|---|---|---|
| 6,258,683 B1 * | 7/2001 | Besser et al. | ............. | 438/306 |
| 2002/0048949 A1 * | 4/2002 | Pyo | ............. | 438/687 |
| 2002/0061645 A1 * | 5/2002 | Trivedi et al. | ............. | 438/640 |
| 2003/0134510 A1 * | 7/2003 | Lee et al. | ............. | 438/674 |
| 2005/0032368 A1 * | 2/2005 | Li et al. | ............. | 438/687 |
| 2005/0070090 A1 * | 3/2005 | Lee et al. | ............. | 438/629 |
| 2005/0074966 A1 * | 4/2005 | Rhodes | ............. | 438/629 |

FOREIGN PATENT DOCUMENTS

JP    2001-168188    6/2001

OTHER PUBLICATIONS

"Electrochemical Planarization by Selective Electroplating for Embedded Gold Wiring in the Sub-Micron Range" 1995 IEEE Region 10 International Conference on Microelectronics and VLSI, Nov. 6-10, 1995, pp. 287-290.*
Keji Miyata; Manufacturing Method of Semiconductor Device; Patent Abstracts of Japan; Publication No. 2001-168188; Publication Date: Jun. 22, 2001; Japan Patent Office, Japan.

* cited by examiner

*Primary Examiner*—Asok K Sarkar
(74) *Attorney, Agent, or Firm*—Andrew D. Fortney (57) ABSTRACT

Methods of forming a metal line in a semiconductor device. A method includes: depositing a first etch stop layer, an interlayer insulating layer, a second etch stop layer, and a line insulating layer on a semiconductor substrate; forming a contact hole pattern on the line insulating layer; forming a contact hole by etching an exposed portion of the interlayer insulating layer using the contact hole pattern as a mask; forming a trench pattern on the line insulating layer; forming a trench by etching an exposed portion of the line insulating layer using the trench pattern as a mask; removing exposed portions of the first etch stop layer and the second etch stop layer after forming the contact hole and the trench; forming a first metal thin film within the contact hole; and forming a second metal thin film on the first metal thin film.

20 Claims, 11 Drawing Sheets

FIG.11

METHODS OF FORMING A METAL LINE IN A SEMICONDUCTOR DEVICE

RELATED APPLICATIONS

This application claims priority from Korean Patent Application No. 10-2004-0087883, which was filed in the Korean Intellectual Property Office on Nov. 1, 2004, and which is hereby incorporated herein by reference in its entirety.

FIELD OF THE DISCLOSURE

The present disclosure relates generally to semiconductor fabrication, and, more particularly, to methods of forming a metal line in a semiconductor device using a dual damascene process.

BACKGROUND

Generally, a metal line of a semiconductor device connects circuits formed within a semiconductor substrate by providing an electrical connection between one or more semiconductor devices and a pad connection. The metal line typically comprises a metal thin film such as an aluminum film, an aluminum alloy film, and/or a copper film.

In forming such a metal line, in order to connect electrodes and pads that are separated by an insulating layer such as an oxide layer, a contact hole is previously formed by selectively etching the insulating layer. A metal plug filling the contact hole is then formed using a barrier metal and tungsten. In addition, a metal line for connecting electrodes and pads is formed by forming a metal thin film at an upper portion of the semiconductor device and patterning it.

A photolithography process is typically used for the patterning of such a metal line. However, it is difficult to form a sufficiently fine pattern of a metal line because of the recent trend of decreasing the CD (critical dimension) of the metal line as semiconductor devices become more miniaturized. Therefore, in order to solve this problem, a damascene process has been introduced to easily form a metal line with a fine pattern.

The damascene process forms a fine metal line layer by: (a) depositing an upper insulating layer such as an oxide layer above an insulating layer after forming a tungsten plug within a contact hole of an insulating layer, (b) removing a portion of the upper insulating layer in a region where a metal line pattern is formed by a photolithography process, (c) depositing a metal thin film thereabove, and then (d) performing a CMP (chemical mechanical polishing) process and planarizing the metal thin film.

However, a seam may be formed in the metal line formed by such a damascene process. This seam may be formed during the deposition of the metal thin film. That is, an empty space that is not filled with a metal thin film when the metal thin film is filled in a contact hole and a trench may be formed, because the contact hole of the interlayer insulating layer and the trench of the insulating layer may have a greater depth than width. This empty space becomes a seam of the metal line. Such a seam may deteriorate the electrical characteristics and reliability of a semiconductor device associated with the metal line.

BRIEF SUMMARY OF THE DISCLOSURE

An example method of forming a metal line in a semiconductor device described herein includes: depositing a first etch stop layer, an interlayer insulating layer, a second etch stop layer, and a line insulating layer on a semiconductor substrate having a predetermined lower structure; forming a contact hole pattern on the line insulating layer; forming a contact hole by etching an exposed portion of the interlayer insulating layer using the contact hole pattern as a mask; forming a trench pattern on the line insulating layer; forming a trench by etching an exposed portion of the line insulating layer using the trench pattern as a mask; removing exposed portions of the first etch stop layer and the second etch stop layer after forming the contact hole and the trench; forming a first metal thin film only within the contact hole; and forming a second metal thin film on the first metal thin film.

The forming of the first metal thin film may include: depositing a first metal seed layer; depositing a sacrificial layer on the first metal seed layer; maintaining the sacrificial layer only within the contact hole; maintaining the first metal seed layer within the contact hole by etching the first metal seed layer using the maintained sacrificial layer as a mask; and forming the first metal thin film by removing the sacrificial layer and by performing electrolysis using the maintained first metal seed layer as an electrode.

The forming of the second metal thin film may include forming a second metal seed layer on an inner wall of the contact hole and an inner wall of the trench where the first metal thin film is not maintained, and forming the second metal thin film by performing electrolysis using the second metal seed layer as an electrode.

A thickness of the maintained sacrificial layer within the contact hole may be greater than about a quarter of a sum of depths of the trench and the contact hole.

The method may further include, before depositing the first metal seed layer, forming a barrier metal layer on inner walls of the contact hole and the trench and on the line insulating layer.

The first and second metal thin films may be made of copper.

The method may further include removing the second metal thin film, the second metal seed layer, and the barrier metal layer on the line insulating layer by a chemical and mechanical polishing process.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Referring to the drawings, an example method of forming a metal line in a semiconductor device performed in accordance with the teachings of the present invention will now be explained in detail. FIG. 1 to FIG. 11 illustrate the example method of forming a metal line in a semiconductor device.

Figure 1:
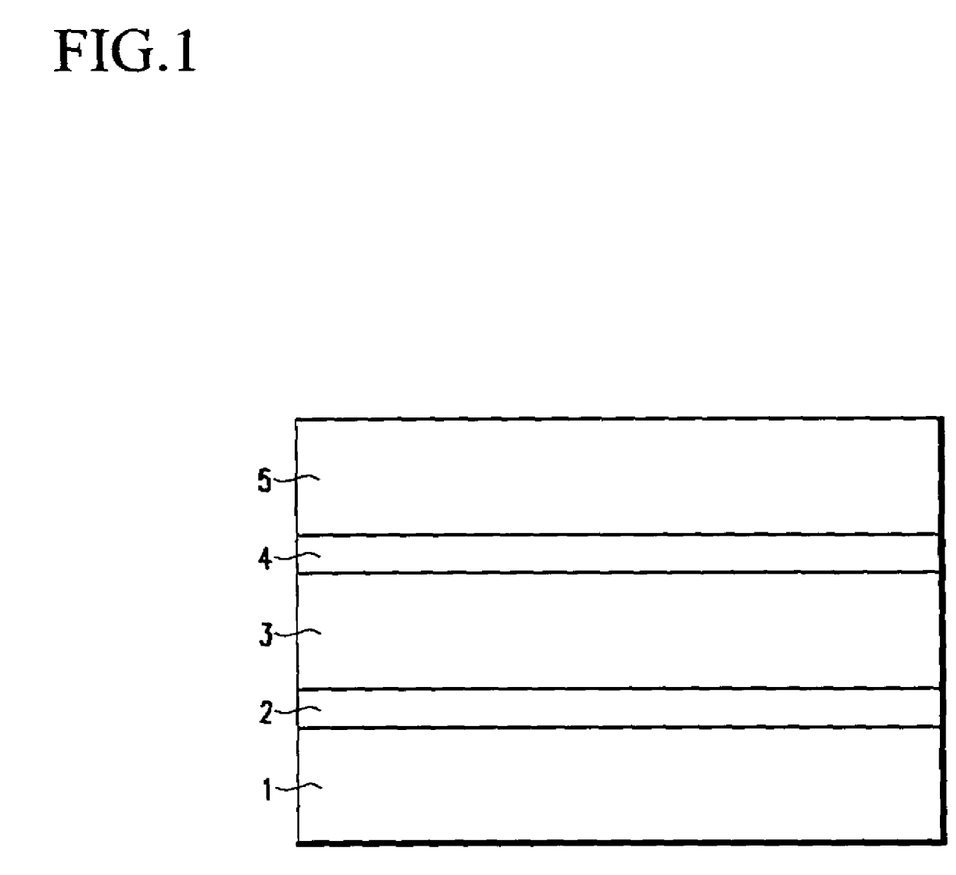
FIG. 1 to FIG. 11 illustrate an example method of forming a metal line in a semiconductor device performed in accordance with the teachings of the present invention.

As shown in FIG. 1, in the example method of forming a metal line in a semiconductor device, a first etch stop layer 2 is formed on a semiconductor substrate 1 including a thin film on which an electrode or an conductive layer of a device is formed. The first etch stop layer 2 can prevent a reaction between a conductive layer and a metal line formed in a subsequent process, and can be used as an etch stop point during etching of an interlayer insulating layer in a subsequent process. In addition, an interlayer insulating layer 3 is deposited on the first etch stop layer 2. A second etch stop layer 4 is formed on the interlayer insulating layer 3. The second etch stop layer 4 may be used as an etch stop point during etching of a line insulating layer in a subsequent process. A line insulating layer 5, which is used to form a metal line layer, is deposited on the second etch stop layer 4.

The first etch stop layer 2 and the second etch stop layer 4 may be formed as a silicon oxynitride (SiON) layer using a PECVD (Plasma Enhanced CVD) apparatus.

For example, the PECVD method may use a gas obtained by mixing $SiH_4$ at about 0 to about 500 sccm, $N_2O$ at about 0 to about 5000 sccm, and $N_2$ at about 0 to about 50,000 sccm. In order to increase uniformity of the resultant layer, a mixed gas for depositing that is diluted by adding an inert gas such as He, Ne, or Ar thereto may also be used.

In addition, the first etch stop layer 2 and the interlayer insulating layer 3 may be formed in the same chamber, and the second etch stop layer 4 and the line insulating layer 5 may be formed in the same chamber. That is, after forming the first etch stop layer 2, the interlayer insulating layer 3 is formed in the same chamber without a vacuum state. After forming the second etch stop layer 4, the line insulating layer 5 is formed in the same chamber without a vacuum state. The reason for this is to make contents of amorphous silicon or polysilicon, Si—N, and Si—O specific, by precisely regulating the PECVD apparatus parameters such as the mixing ratio of the deposit gases for forming the first etch stop layer 2 and the second etch stop layer 4, the plasma excitation electric power, the substrate temperature, and the chamber pressure.

The first etch stop layer 2 and the second etch stop layer 4 may prevent pattern inferiority and damage to the lower thin film that may be caused by over-etching due to an etch rate difference between the interlayer insulating layer 3 and the line insulating layer 5 in a subsequent etching process.

Figure 2:
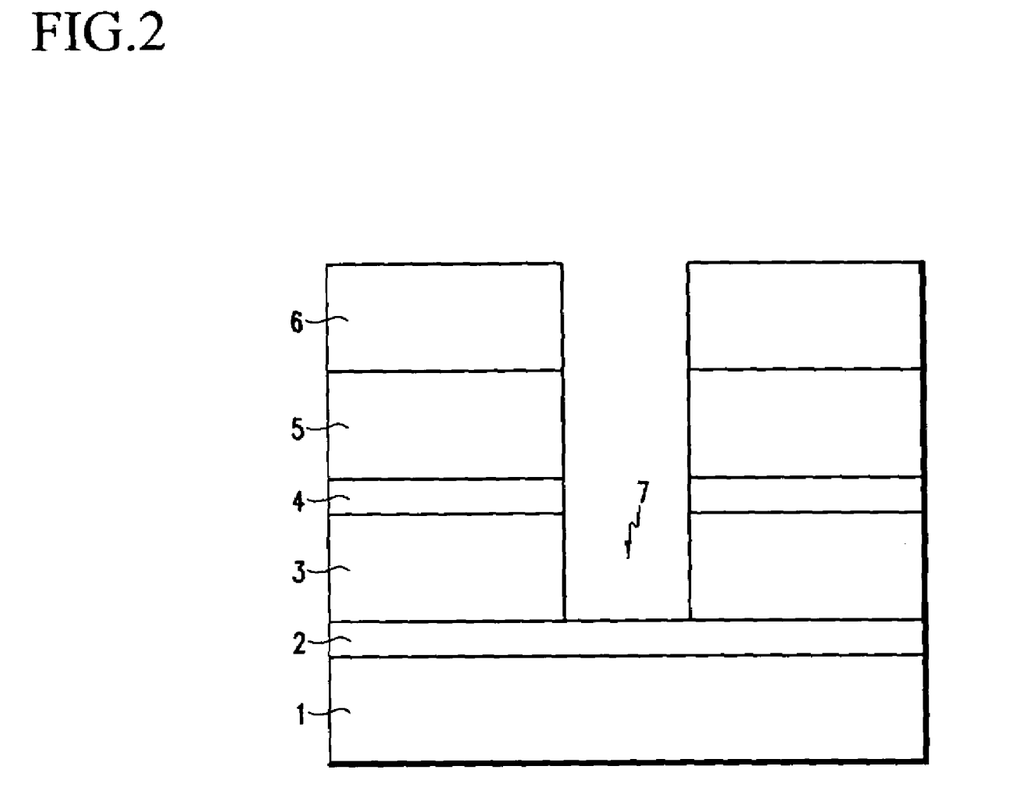

Next, as shown in FIG. 2, a contact hole pattern 6 used for forming a contact hole is formed on the line insulating layer 5. An exposed portion of the line insulating layer 5 is then removed by performing dry etching with plasma and using the contact hole pattern 6 as a mask. Subsequently, an exposed portion of the second etch stop layer 4 is removed by etching, and an exposed portion of the interlayer insulating layer 3 is removed by etching. As a result, a contact hole 7 is formed in the interlayer insulating layer 3.

Figure 3:
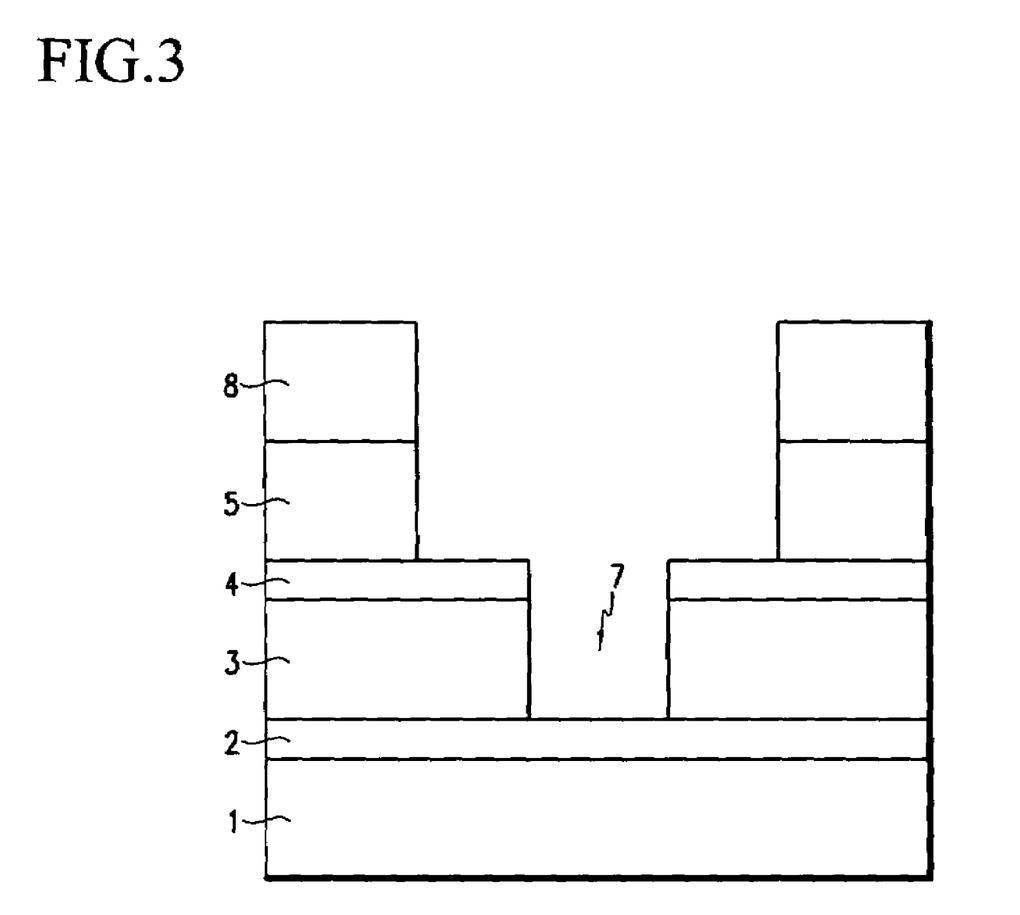

Then, as shown in FIG. 3, after removing the contact hole pattern 6, a trench pattern 8 is formed on the line insulating layer 5. The trench pattern 8 is used to form a trench in which a metal line is to be located. The trench in which the metal line is to be located is then formed in the line insulating layer 5 by removing an exposed portion of the line insulating layer 5 by, for example, performing dry etching with plasma using the trench pattern 8 as a mask. The second etch stop layer 4 serves to stop the etching, and thereby prevents an upper surface of the interlayer insulating layer 3 from being etched. That is, by depositing the second etch stop layer 4 on the interlayer insulating layer 3, etching of the surface of the interlayer insulating layer 3 while etching the line insulating layer 5 can be prevented.

Figure 4:
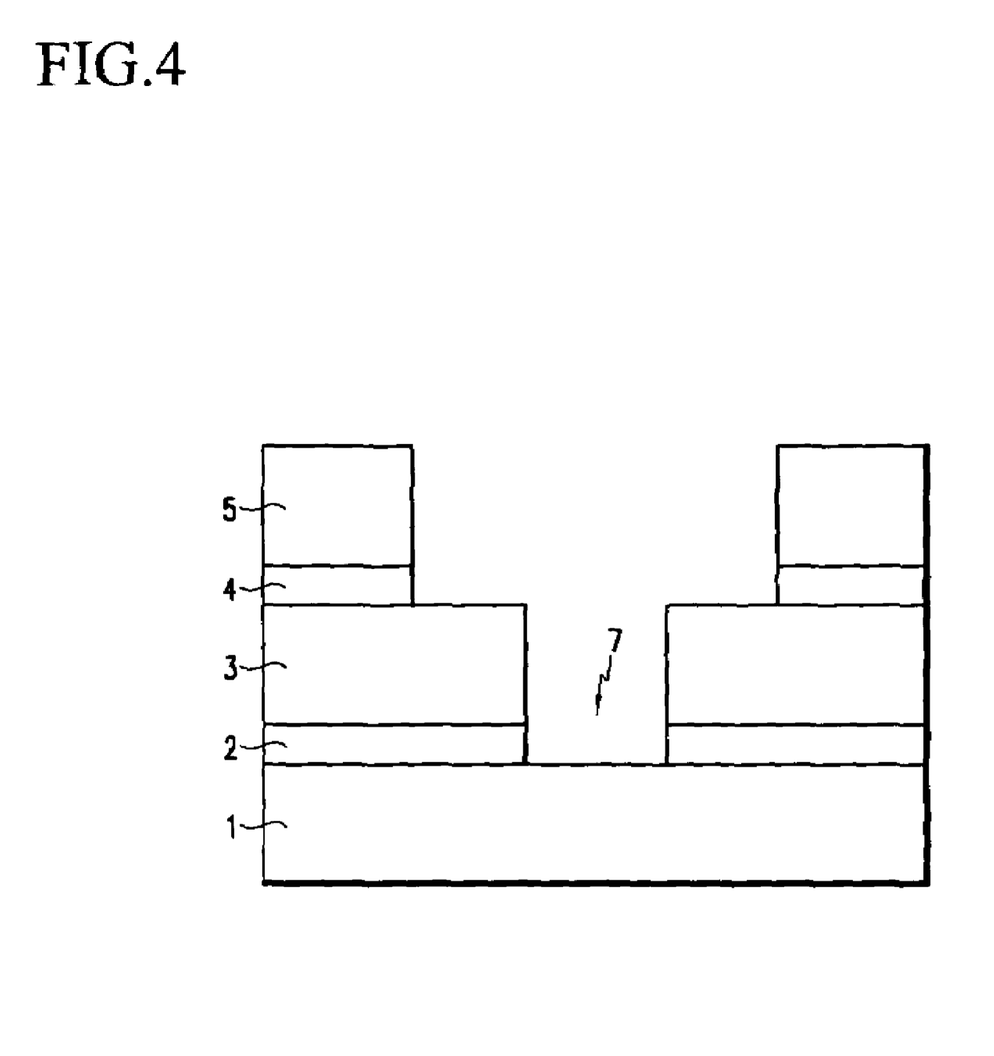

Then, as shown in FIG. 4, after completing the etching of the line insulating layer 5 to expose a portion of an upper surface of the second etch stop layer 4, the trench pattern 8 on the line insulating layer 5 is removed. In addition, the area of the first etch stop layer 2 exposed by the contact hole 7 and the area of the second etch stop layer 4 exposed by the trench are removed. It is preferable to remove the exposed portions of the first etch stop layer 2 and the second etch stop layer 4 in order to allow current to flow from a metal line to a conductive layer of the lower thin film 1, and to obtain a desired dielectric capacitance, since the first etch stop layer 2 and the second etch stop layer 4 are insulating layers.

Although in the above-explained example, a trench is formed after forming a contact hole, it is also possible to form a trench before forming the contact hole, or to simultaneously form the trench and the contact hole.

Figure 5:
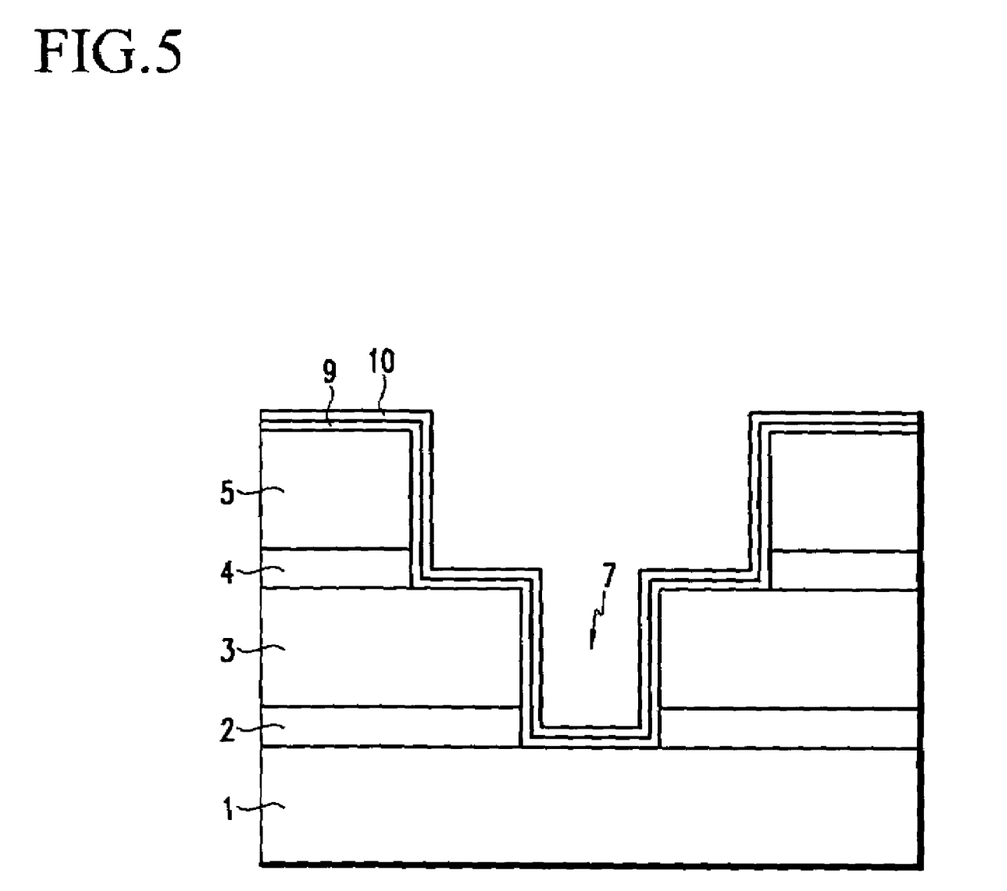

Then, as shown in FIG. 5, before depositing a metal thin film, a barrier metal layer 9 is deposited on the entire upper surface of the lower thin film of the semiconductor substrate 1, in order to prevent a reaction between the metal thin film and a conductive layer of the lower thin film of the semiconductor substrate 1. However, in another example, a barrier metal layer is not formed. An example in which a barrier metal layer is formed will be explained hereinafter.

The barrier metal layer 9 may be formed by depositing TaN to a thickness in the hundreds of Å. Since the barrier metal layer 9 has substantial inherent resistance, in order for electrons to be sufficiently supplied to a surface of a thin film during a process of forming a metal thin film by an EPD (electroplating process deposition) process, a first metal seed layer 10 is deposited on the barrier metal layer 9 to a thickness in the hundreds of Å. The first metal seed layer 10 may be formed of, for example, copper (Cu).

Figure 6:
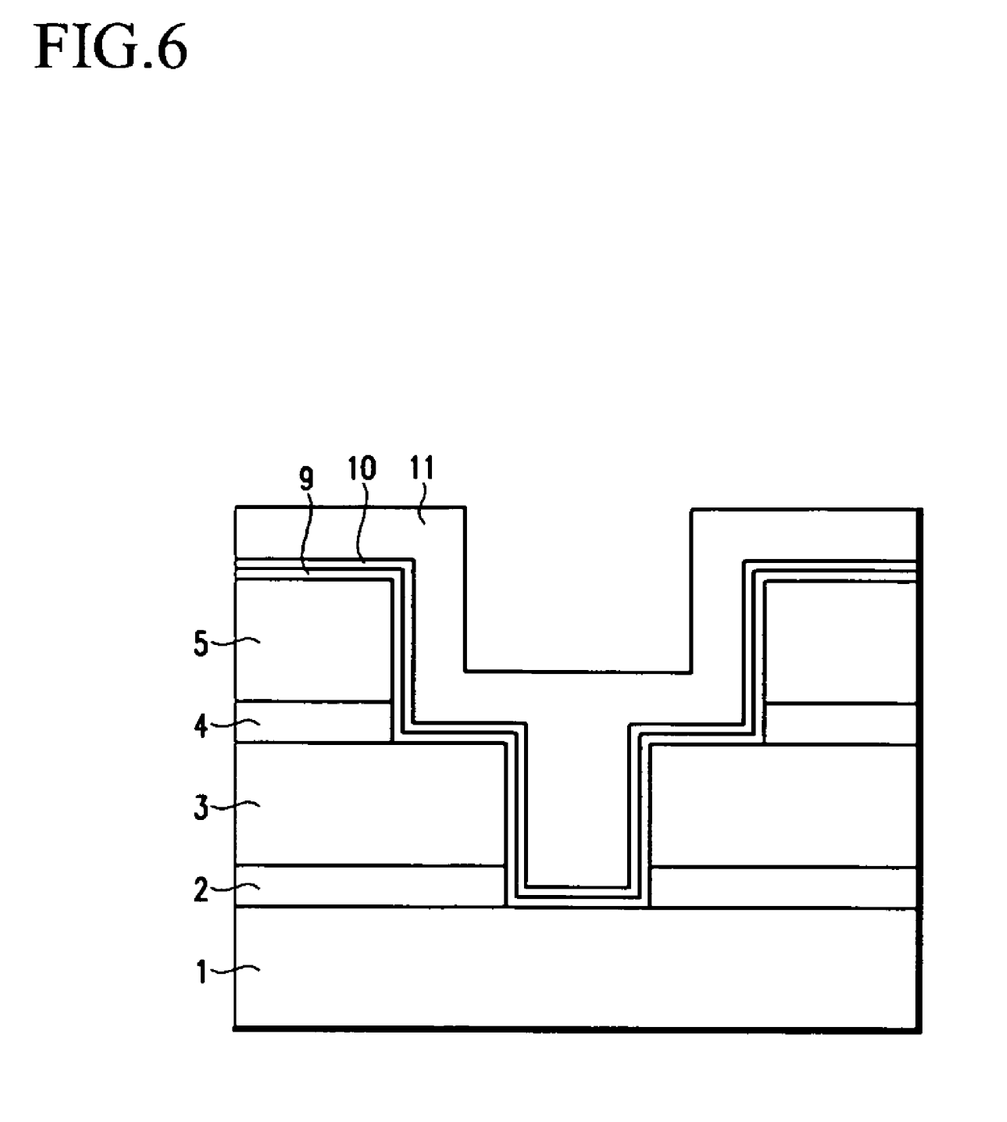

Subsequently, as shown in FIG. 6, a sacrificial layer 11 is formed on the entire upper surface of the structure shown in FIG. 5 which, as discussed above, includes the first metal seed layer 10. The sacrificial layer 11 may be formed of material such as, for instance, a photosensitive material, an anti-reflective coating (BARC), a nitride (Ni), an oxide ($O_x$), polysilicon, or the like.

Figure 7:
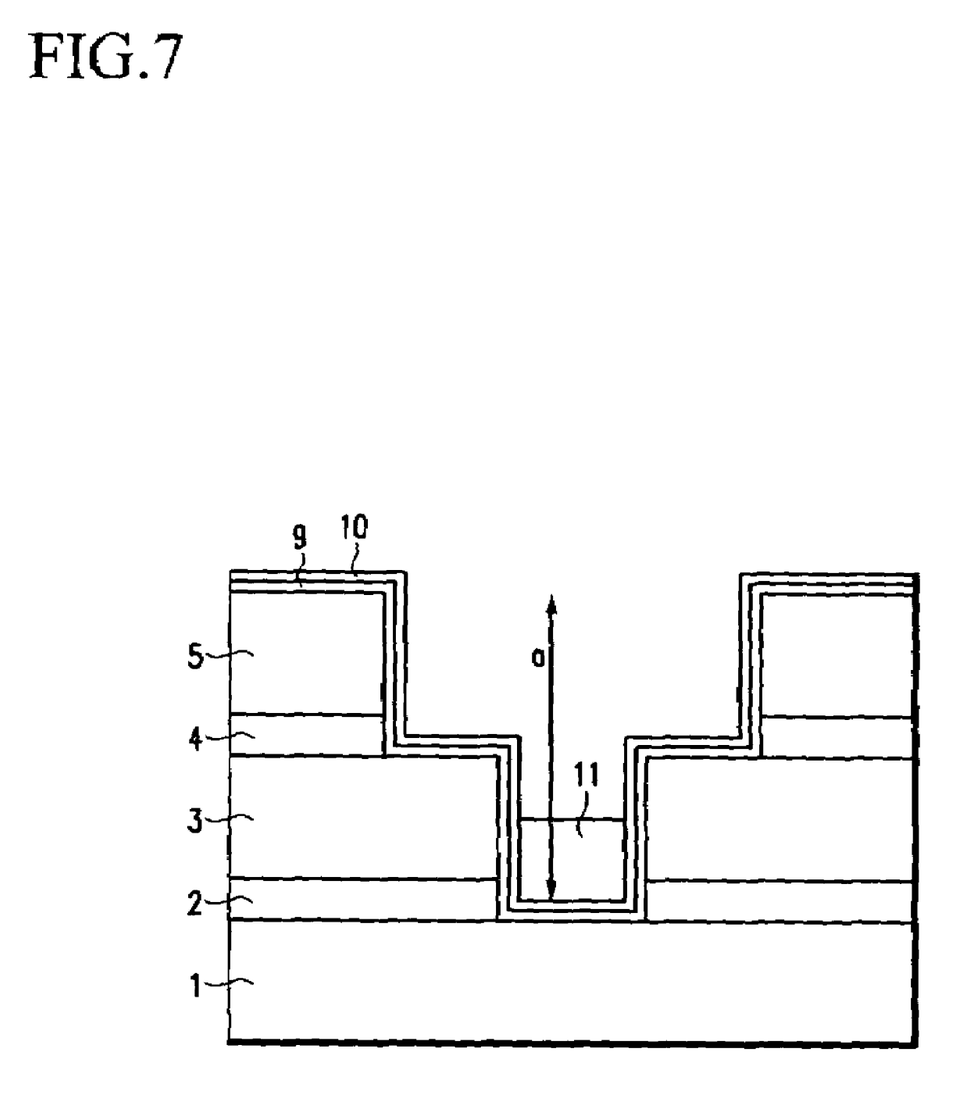

Then, as shown in FIG. 7, a portion of the sacrificial layer 11 is removed by performing etching on the entire surface thereof. The etching is performed such that a portion of the sacrificial layer 11 remains within the contact hole 7 of the interlayer insulating layer 3. The thickness of the sacrificial layer 11 remaining within the contact hole 7 is preferably greater than about a quarter of the sum ("a" in FIG. 7) of the depths of the trench and the contact hole 7.

Figure 8:
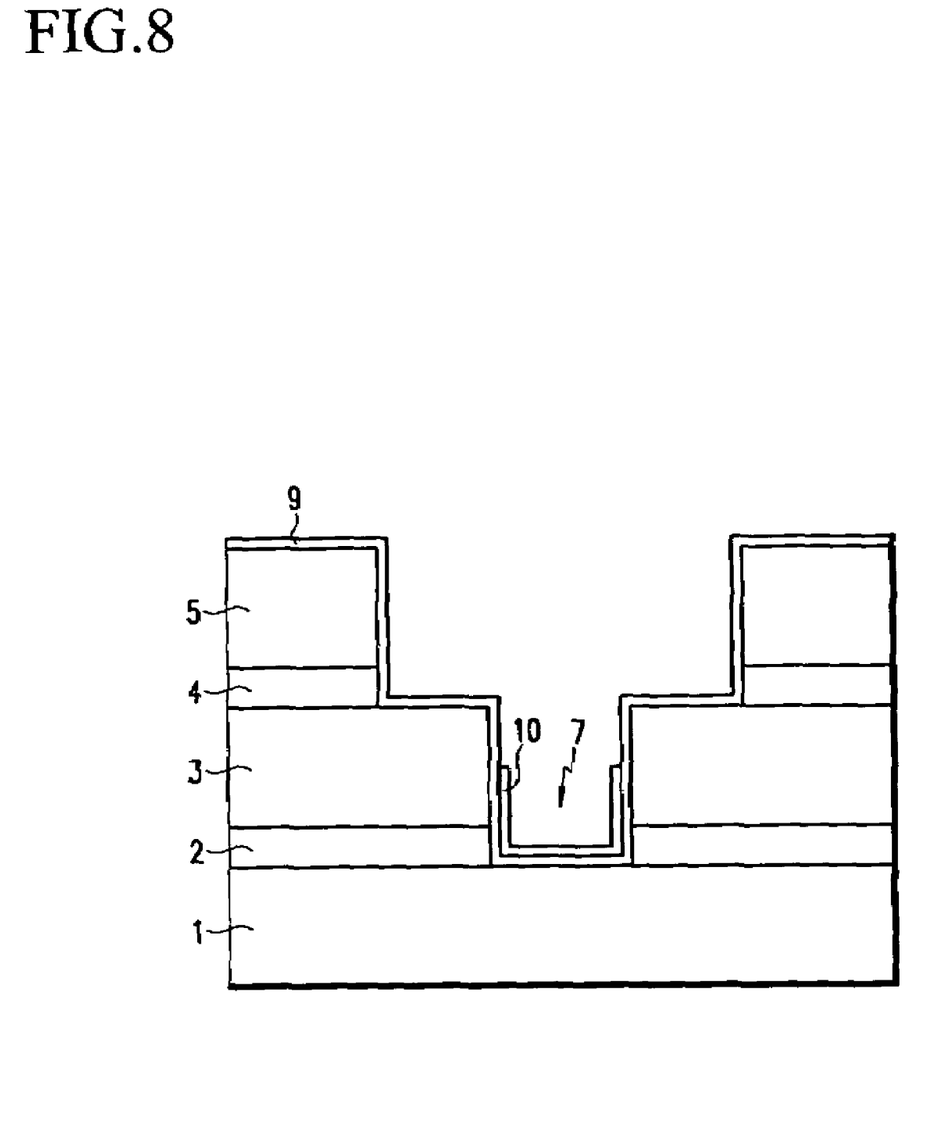

The first metal seed layer 10 is then etched using the sacrificial layer 11 as a mask. The sacrificial layer 11 is then removed. As a result, as shown in FIG. 8, the first metal seed layer 10 is maintained only on an inner wall of the contact hole 7.

The remaining portion of the first metal seed layer 10 may act as an electrode when forming a metal thin film by an electroplating process for deposition.

Figure 9:
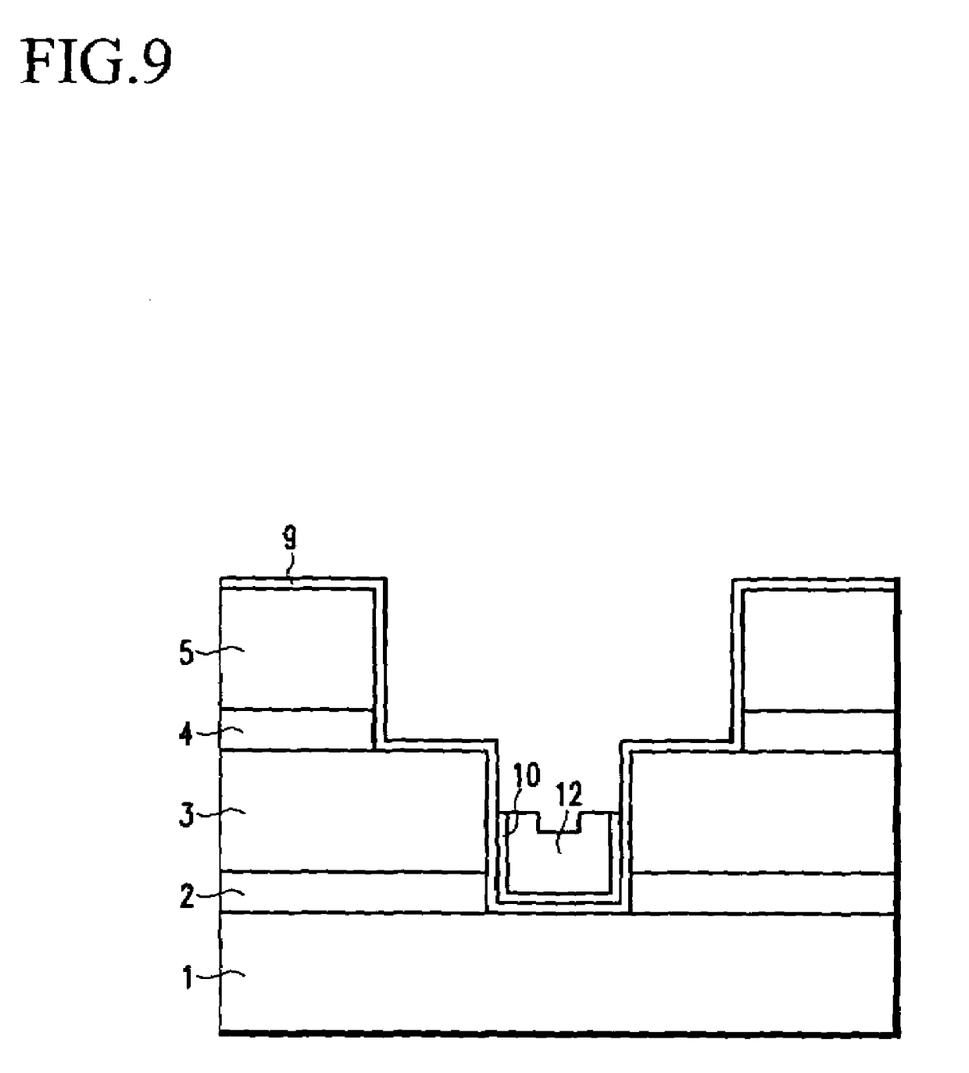

Then, as shown in FIG. 9, a first metal thin film 12 is formed by an electroplating deposition process. In the illustrated example, the first metal thin film 12 is formed only within the contact hole 7 of the interlayer insulating layer 3 where the first metal seed layer 10 remains.

Figure 10:
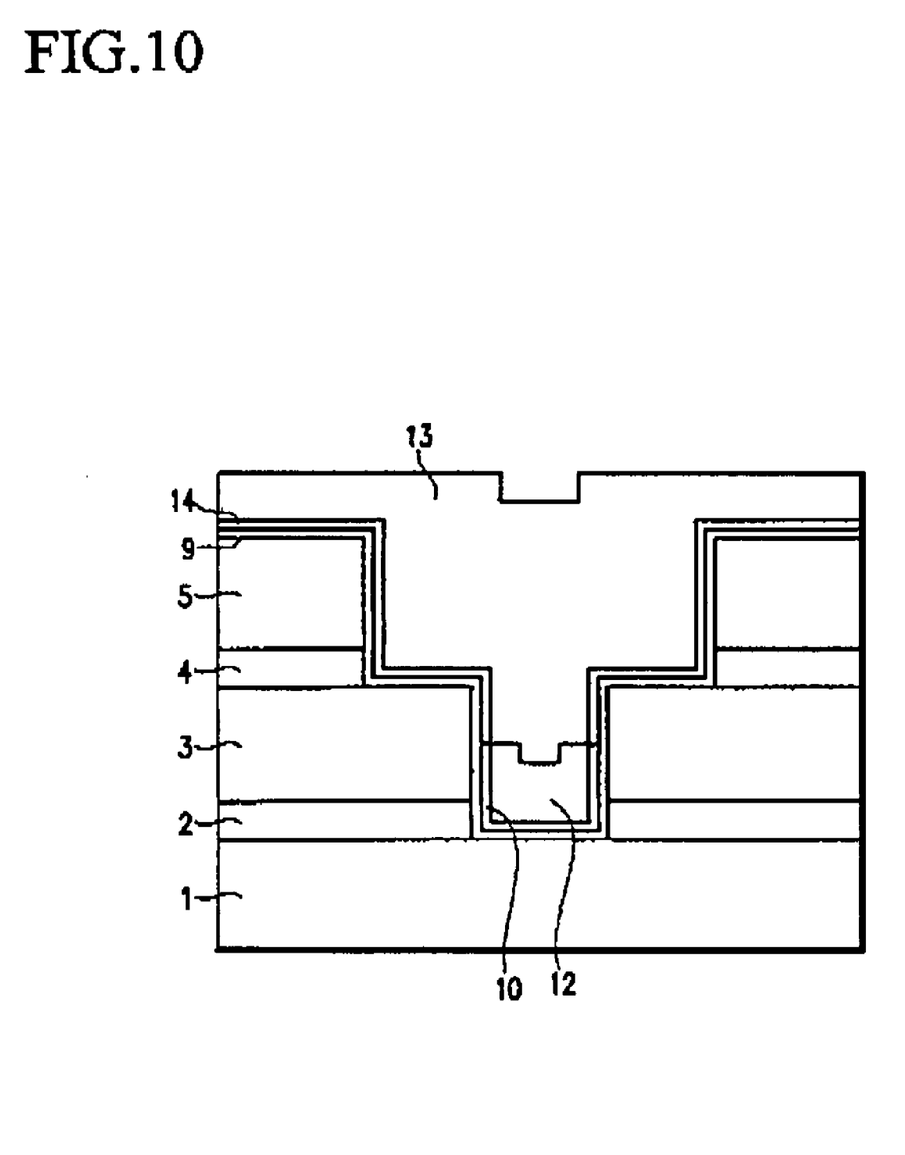

Then, as shown in FIG. 10, a second metal seed layer 14 is formed on a portion of the barrier metal layer 9 where the first metal thin film 12 does not exist. A second metal thin film 13 is then formed by an electroplating deposition process using the second metal seed layer 14 as an electrode. The second metal seed layer 14 and the second metal thin film 13 may be formed of, for example, copper.

Figure 11:
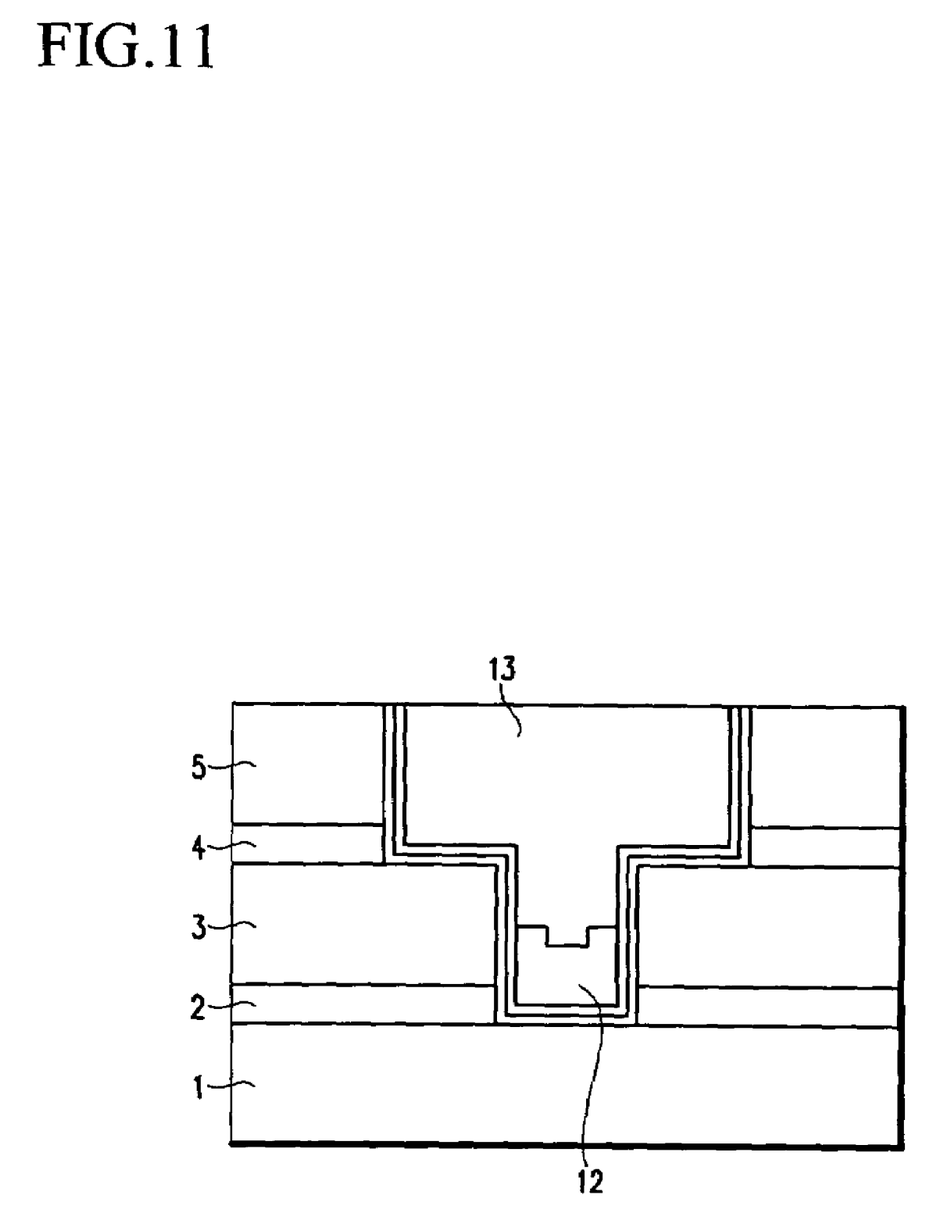

Subsequently, as shown in FIG. 11, a stable metal line of a semiconductor device is completed by removing the second metal thin film 13, the second metal seed layer 14, and the barrier metal layer 9 on the line insulating layer 5 by polishing the same using, for example, a CMP process. The metal line may be, for example, a copper line.

From the foregoing, persons of ordinary skill in the art will readily appreciate that, since a first metal layer partially filling a contact hole is formed, and then a second metal layer is formed on the first metal layer in a damascene process, a seam can be prevented from forming in a metal line. Therefore, the electrical characteristics of a semiconductor device fabricated using any of the above-described methods can be improved, and a more stable device can be realized.

From the foregoing, persons of ordinary skill in the art will further appreciate that methods of forming a metal line in a semiconductor device have been disclosed which reduce or prevent generation of a seam in a metal line.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of forming a metal line in a semiconductor device, comprising:
    sequentially depositing a first etch stop layer, an interlayer insulating layer, a second etch stop layer, and a line insulating layer over a semiconductor substrate;
    forming a contact hole pattern on the line insulating layer;
    forming a contact hole by etching an exposed portion of the line insulating layer, the second etch stop layer, and the interlayer insulating layer using the contact hole pattern as a mask;
    forming a trench pattern on the line insulating layer;
    forming a trench by etching an exposed portion of the line insulating layer using the trench pattern as a mask;
    removing exposed portions of the first etch stop layer and the second etch stop layer after forming the contact hole and the trench;
    forming a barrier metal layer in the contact hole and the trench;
    forming a first metal seed layer on the barrier metal layer in a lower portion of the contact hole;
    forming a first metal thin film only within the contact hole on the first metal seed layer;
    forming a second metal seed layer on the barrier metal layer in the trench and a portion of the contact hole where the first metal thin film is absent; and
    forming a second metal thin film on the second metal seed layer.

2. The method of claim 1, wherein forming the first metal thin film comprises:
    depositing a first metal material on entire exposed surfaces of the contact hole, the trench, and on the line insulating layer;
    depositing a sacrificial layer on the first metal material;
    etching the sacrificial layer to form an etched sacrificial layer covering a portion of the first metal material in the contact hole;
    etching the first metal material using the etched sacrificial layer as a mask to form the first metal seed layer within the contact hole; and
    forming the first metal thin film by removing the etched sacrificial layer and by performing electrolysis using the remaining portion of the first metal seed layer as an electrode.

3. The method of claim 2, wherein a thickness of the etched sacrificial layer within the contact hole is greater than about a quarter of a sum of a depth of the trench and a depth of the contact hole.

4. The method of claim 2, further comprising removing the sacrificial layer from the trench and a portion of the contact hole.

5. The method of claim 2, wherein etching the first metal material removes the first metal material from an entire surface of the line insulating layer, an entire surface of the trench, and a partial surface of the contact hole.

6. The method of claim 2, wherein the first metal seed layer comprises copper.

7. The method of claim 1, wherein forming the second metal thin film comprises performing electrolysis using the second metal seed layer as an electrode.

8. The method of claim 1, wherein the barrier metal layer is formed on inner walls of the contact hole and the trench, and on the line insulating layer.

9. The method of claim 8, further comprising removing the second metal thin film, the second metal seed layer, and the barrier metal layer on the line insulating layer by chemical and mechanical polishing.

10. The method of claim 8, wherein forming the barrier layer comprises depositing TaN.

11. The method of claim 8, wherein the first metal material is deposited on the barrier metal layer to a thickness in the hundreds of Å.

12. The method of claim 1, wherein the first and the second metal thin films comprise copper.

13. The method of claim 1, wherein each of the first etch stop layer and the second etch stop layer comprises a silicon oxynitride (SiON) layer.

14. The method of claim 13, wherein depositing each of the first and second etch stop layers comprises PECVD (Plasma Enhanced CVD).

15. The method of claim 1, wherein the second metal seed layer comprises copper.

16. The method of claim 1, wherein the first metal thin film comprises copper.

17. The method of claim 16, wherein the second metal thin film comprises copper.

18. A method of forming a metal line in a semiconductor device using a dual damascene process, comprising:
    sequentially forming a contact hole and a trench having a greater width than the contact hole on a semiconductor substrate having a device structure thereon;
    forming a first metal seed layer on a portion of an inner wall of the contact hole;
    forming a first metal thin film over the portion of the contact hole covered by the first metal seed layer;
    forming a second metal seed layer on an entire upper surface of the semiconductor substrate where the first metal thin film is absent;
    forming a second metal thin film on an entire upper surface of the semiconductor substrate having the second metal seed layer and the first metal thin film; and
    removing portions of the second metal thin film and the second metal seed layer except portions of the second metal thin film and the second metal seed layer formed within the contact hole and the trench.

19. The method of claim 18, further comprising forming a barrier metal layer on an entire upper surface of the semiconductor substrate after forming the contact hole and the trench.

20. The method of claim 18, further comprising removing a portion of the barrier metal layer except a portion of the barrier metal layer formed within the contact hole and the trench.

* * * * *